United States Patent

[11] 3,573,489

[72] Inventor Bohumir Sramek
Phoenix, Ariz.
[21] Appl. No. 845,924
[22] Filed May 29, 1969
[45] Patented Apr. 6, 1971
[73] Assignee General Electric Company

[54] HIGH SPEED CURRENT-MODE LOGIC GATE
11 Claims, 3 Drawing Figs.

[52] U.S. Cl. .......... 307/215, 307/218, 307/213, 307/254
[51] Int. Cl. .......... H03k19/34, H03k 19/30
[50] Field of Search .......... 307/207, 213, 214, 215, 218, 254

[56] References Cited
UNITED STATES PATENTS
3,396,282 8/1968 Sheng et al. .......... 307/215X
3,505,535 4/1970 Cavaliere .......... 307/218X

*Primary Examiner*—Donald D. Forrer
*Assistant Examiner*—L. N. Anagnos
*Attorneys*—Lloyd B. Guernsey, Edward W. Hughes, Frank L. Neuhauser and Joseph B. Forman

ABSTRACT: A common-base transistor amplifier in the collector circuit of a current-mode logic gate reduces the Miller effect or multiplication of capacitance between the base and collector of transistors connected to the signal-input terminals. This increases the operating speed and increases the fan-out of the logic gate.

Patented April 6, 1971 3,573,489

2 Sheets-Sheet 1

INVENTOR.
BOHUMIR SRAMEK
BY
Hoyt B. Guernsey
AGENT

HIGH SPEED CURRENT-MODE LOGIC GATE

BACKGROUND OF THE INVENTION

This invention relates to logic gates and more particularly to current-mode logic gates having increased fan-out and increased speed of operation. Data processing systems employ logic signals to control the flow of information to various portions of the processing system and also to perform various arithmetic operations in the data processing system. In many of these data processing systems, it is desirable to have both OR and NOR logic. The OR logic signals are developed by OR-gates which provide the logical operation of inclusive-OR for positive signals applied thereto. The OR-gate provides an output signal representing a binary 1, when any one or more of the input signals applied thereto represent binary 1's. When none of the input signals represent binary 1's, the output signal represents a binary 0. The NOR logic signals are developed by NOR-gates which provide the NOR logical operation for positive signals applied thereto. The NOR-gate provides an output signal representing a binary 1, when none of the input signals applied thereto represent binary 1's. When one or more of the input signals represent binary 1's, the output signal represents a binary 0.

NOR logic signals and OR logic signals can be developed by a current-mode logic gate having a pair of signal-output terminals. A NOR logic signal is provided at one of the output terminals and an OR logic signal is provided at the other output terminal. The current-mode logic gate can be used to supply logic signals to a plurality of other current-mode logic gates. However, the prior art gates have a relatively low fan-out so that a gate can drive only a few other gates. Fan-out can be defined as a number of similar circuits that can be driven by a single circuit. For example, if one gate provides enough output signal to drive 10 similar gates, the fan-out would be 10. In prior art systems employing gates having a low fan-out, it is necessary to use a large number of circuits for the gates so that the data processing system is bulky and expensive to construct.

The present invention alleviates the disadvantages of a prior art NOR/OR-gate by providing an OR output signal and a NOR output signal from a single gate having a relatively high fan-out. This reduces the number of NOR/OR-gates required in a data processing system and reduces the size and expense of building high speed data processing systems.

Prior art NOR/OR-gates employ transistors connected in a common-emitter configuration with the base of each of the transistors being connected to a corresponding signal-input terminal. Each of the transistors connected to the signal-input terminals has capacitance between the base and the collector of the common-emitter transistor circuit. The capacitance between the base and the collector of the common-emitter transistor is multiplied by the Miller effect which limits the speed of operation, limits the fan-out of the current-mode logic circuit, and causes an appreciable delay between the time a signal is received at a signal-input terminal and the time an output signal is developed at a signal-output terminal of the gate.

The present invention alleviates the disadvantages of the prior art by providing means for reducing the Miller effect of the capacitance between the base and the collector of a common-emitter transistor amplifier circuit. This increases the speed of operation and increases the fan-out of the NOR/OR-gate.

It is, therefore, an object of this invention to provide a current-mode logic gate having increased speed of operation.

Another object of this invention is to provide a current-mode logic gate having increased fan-out.

A further object of this invention is to provide a current-mode logic gate having reduced input capacitance at the signal-input terminals.

Still another object of this invention is to provide a current-mode logic gate having fast switching characteristics.

Another object of this invention is to provide a current-mode logic gate having decreased time delay between the input terminals and the output terminals.

A further object of this invention is to provide a current-mode logic gate having improved isolation between the signal-input terminals and the output terminals.

SUMMARY OF THE INVENTION

The foregoing objects are achieved in the instant invention by providing a new and improved current-mode logic gate which develops both OR and NOR logic signals and which has increased speed of operation and has increased fan-out by employing a common-base transistor amplifier between the transistors of the input circuit and the transistors of the output circuit.

Other objects and advantages of this invention will become apparent from the following description when taken in connection with the accompanying drawings.

DESCRIPTION OF THE PREFERRED EMBODIMENT

Figure 1:
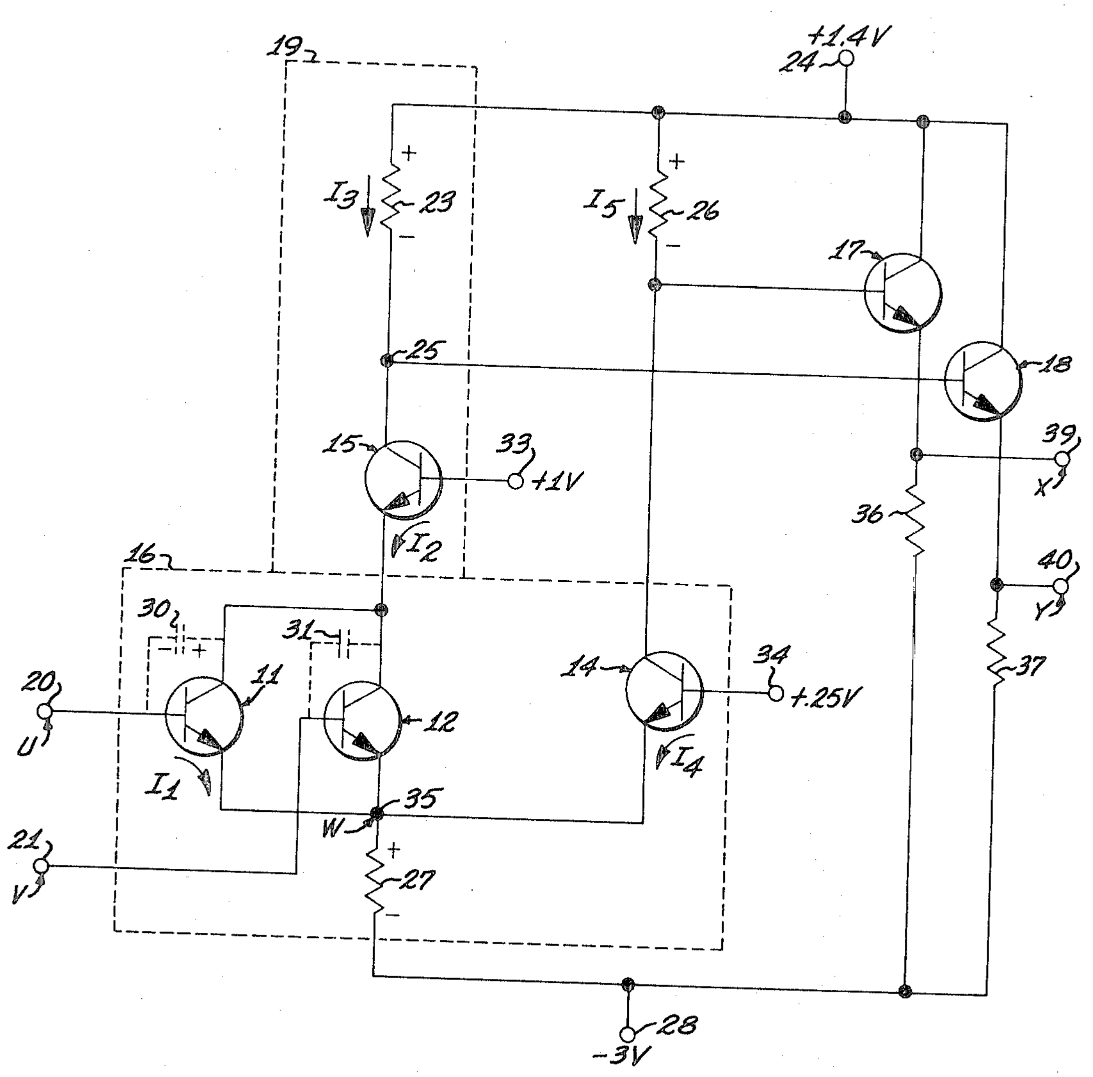
FIG. 1 is a circuit diagram of an embodiment of the instant invention.

The circuit shown in FIG. 1 includes only a pair of input transistors 11 and 12, a transistor 14 connected in the common-mode with transistors 11 and 12, a transistor 15 connected in a common-base configuration and a pair of output transistors 17 and 18 connected as emitter followers. It should be understood, however, that any reasonable number of input transistors may be provided. The collector of each of the other input transistors would be connected to the collectors of transistors 11 and 12 and the emitter of each of the other input transistors would be connected to the emitters of transistors 11 and 12. Positive signal voltages representing binary 1's and ground potential voltages representing binary 0's may be received at each of the signal-input terminals 20 and 21. These signal voltages are coupled to the bases of input transistors 11 and 12 respectively. The bases of the other input transistors may each be connected to a separate signal-input terminal and signals may be received at each of these input terminals. The collectors of the input transistors 11 and 12 are connected to the emitter of a transistor 15. The collector of transistor 15 is connected by resistor 23 to a terminal 24 which is connected to a positive reference potential, such as a positive 1.4 v. The collector of the reference transistor 14 is connected through a resistor 26 to terminal 24. The emitters of the input transistors and the reference transistor are coupled through a resistor 27 to a terminal 28 which is connected to a negative reference potential, such as a negative 3 v. The input transistors 11 and 12 and the reference transistor 14 comprise a current-mode logic gate 16 of the type used in prior art logic circuits.

Transistor 15, connected in a common-base configuration, has been connected in the collector circuit of transistors 11 and 12 to reduce the Miller effect in the input circuits. The Miller effect multiplies the effect of the physical capacitance between the base and collector of a common-emitter transistor circuit such as the circuit shown connected to input transistors 11 and 12. Due to the physical arrangements of the elements in a transistor, a distributed capacitance exists, inside the transistor, between the collector and the base of each transistor such as those used in FIG. 1. Distributed capacitance between the collector and base of transistors 11 and 12 is represented by the dashed leads and dashed configurations of capacitors 30 and 31.

In prior art circuits do not use the common-base transistor 15, the collectors of transistors 11 and 12 are connected to the lower end of resistor 23. In the prior art circuit, the actual physical capacitance between the base and the collector of transistors 11 and 12 is effectively multiplied by a factor of 1+A where A is the voltage gain of the common-emitter amplifier.

If the gain A of the amplifier stage, for example is 10, the effective input capacitance between the base and the collector will be 11 or (1+A) times the actual physical capacitance between the base and collector of the transistor. This value of 1+A is obtained in the following manner. For example, assume the actual physical capacitance is 1 microfarad; the gain of the amplifiers is 10 and an input signal is applied at input terminal 20. If the input signal decreases 1 v. below the previous value, the voltage at the collector increases 10 v. in a positive direction. The voltage on the right-hand plate of capacitor 30 increases 10 v. and the voltage on the left-hand plate decreases 1 v. so that the voltage across the capacitor changes 11 v. The quantity of charge on the capacitor is given by the formula $Q=CE$ where $Q$ is the quantity of charge on the capacitor, $C$ is the actual physical capacity of the capacitor and $E$ is the voltage across the capacitor. Thus, the change in charge on the capacitor is 11 times 1 microfarad or 11 times the quantity of charge which the capacitor would have if the voltage at the collector of transistor 11 did not change. This charge on the right-hand plate of the capacitor 30 is supplied by the reference potential at terminal 24. The charge on the left-hand plate must be supplied by the 1 v. signal source at terminal 20. This charge is 11 times the quantity of charge which would be supplied by the signal source if the voltage at the collector of transistor 11 did not change. So the capacitance 30 appears to be 11 times as large as it actually is.

When the input terminals of similar logic gates are connected to the output terminals, current from the output terminals must supply the charge to the input capacitors 30. This causes the fan-out to be low in prior art circuits which do not use the transistor 15 connected as a common-base amplifier. Also some time is required to charge each of the input capacitors 30 so that the speed of operation of the prior art circuits is limited.

The speed of operation of the circuits may be increased and the fan-out increased by the addition of a common-base amplifier 19 connected between the collector of the common-emitter transistors 11 and 12 and the collector load resistor of these transistors. The base of the transistor 15 is connected to a signal ground at terminal 33. Signal ground at terminal 33 is provided by reference potential such as +1 v. The constant value of voltage at terminal 33 and at the base of transistor 15 provides a constant value of voltage at the emitter of transistor 15 and at the collectors of transistors 11 and 12. The constant value of voltage at the collectors of transistors 11 and 12 reduces the amount of change in the value of the charge on the distributed capacitances 30 and 31, thus decreasing the time required to discharge distributed capacitor 30 or 31 when the signal at the base of transistor 11 or transistor 12 changes. Reducing the amount of change in the value of charge on capacitances 30 and 31 also decreases the portion of the input signal required to charge these capacitances and increases the value of signal obtained from output terminals 39 and 40. Thus, transistor 15 increases the speed of operation of the common-emitter circuit and increases the fan-out of the circuit.

Figure 2:
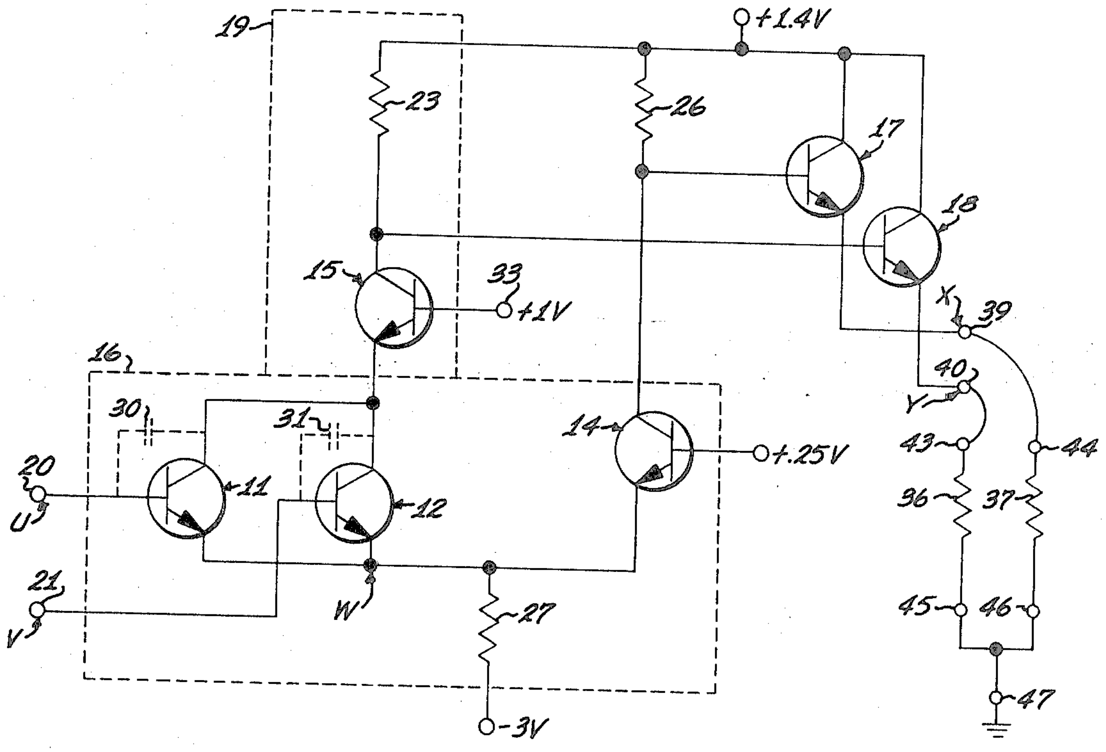
FIG. 2 is a circuit diagram of another embodiment of the instant invention.
Figure 3:
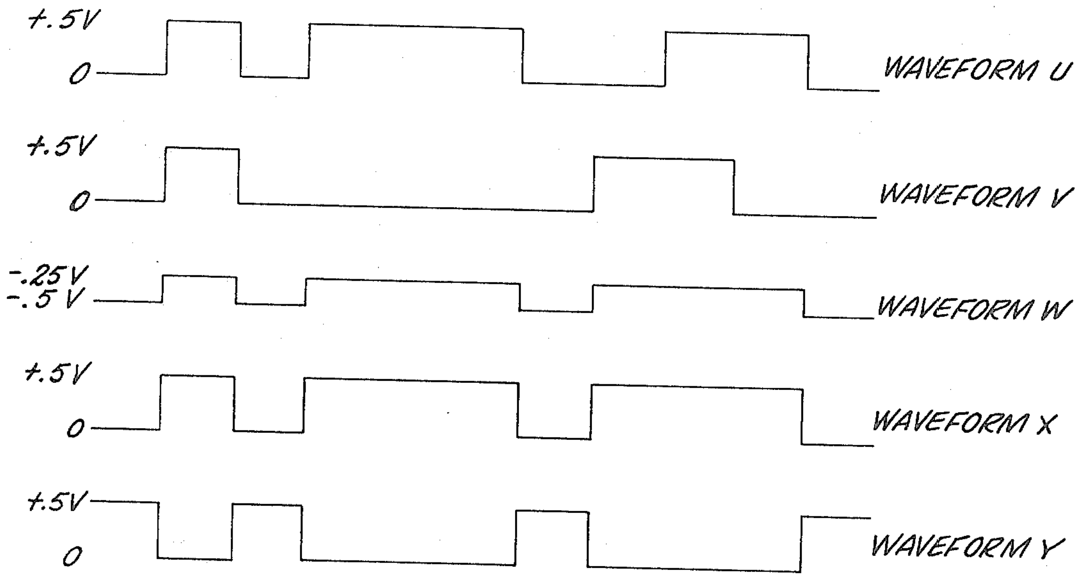
FIG. 3 illustrates waveforms which are useful in explaining the operation of the circuit shown in FIG. 1.

The operation of the improved circuit shown in FIG. 1 will now be described. When a positive signal representing a binary 1 is applied at either terminal 20 or 21, a corresponding one of the input transistors 11 or 12 is rendered conductive. For example, when a +0.5 v., such as shown in waveform U of FIG. 2, is applied to input terminal 20, a current $I_1$ flows from the terminal 20, through base-to-emitter of transistor 11, and through resistor 27 to the negative 3 v. potential at terminal 28. Current $I_1$ renders transistor 11 conductive so that a current $I_2$ flows from the +1 v. potential at terminal 33, through base-to-emitter of transistor 15, through collector-to-emitter of transistor 11 and through resistor 27 to terminal 28. Current $I_2$ renders transistor 15 conductive so that current $I_3$ flows from the terminal 24, through resistor 23, through collector-to-emitter of transistor 15, through collector-to-emitter of transistor 11 and resistor 27 to terminal 28. The current through resistor 23 provides a voltage drop across resistor 23 so the voltage at the junction point 25 and at the base of transistor 18 decreases. The decrease in voltage at the base of transistor causes the voltage at the emitter of the emitter follower to decrease to approximately zero potential representing a binary 0.

At this time, the current through resistor 27 provides a voltage drop across resistor 27 of approximately 2.75 v. of the polarity shown so that the voltage at junction point 35 is approximately a −0.25. v. The −0.25 v. at junction point 35 and the +0.25 v. at the base of the reference transistor 14 provides a +0.5 v. between the base and emitter of transistor 14. A typical transistor requires approximately +0.6 v. between the base and the emitter to cause the transistor to start conducting. The +0.5 v. between the base and emitter of reference transistor 14 is less than the voltage required to render transistor 14 conductive so that transistor 14 remains nonconductive while any of the input transistors are conductive. When reference transistor 14 is nonconductive, no current flows through transistor 14 so that a positive voltage is developed at the collector of transistor 14 and at the base of transistor 17. The positive voltage at the base of transistor 17 renders transistor 17 conductive so that a positive voltage representing a binary 1 is developed at the emitter of transistor 17 and at the signal-output terminal 39.

When zero voltages representing binary 0's are applied simultaneously to both input terminals 20 and 21, input transistors 11 and 12 are both rendered nonconductive. When transistors 11 and 12 are nonconductive, currents $I_1$, $I_2$ and $I_3$ are no longer flow through resistor 27 and no longer produce a voltage drop across resistor 27. The +0.25 potential at terminal 34 and the negative 3 v. potential at terminal 38 now cause a current $I_4$ to flow from terminal 34, through the base-to-emitter of transistor 14 and resistor 27 to terminal 28. Current $I_4$ renders reference transistor 14 conductive. A current $I_5$ now flows from terminal 24, through resistor 26, through collector-to-emitter of transistor 14 and resistor 27 to terminal 28. Current $I_5$ through resistor 26 provides a voltage drop of the polarity shown across resistor 26. The value of resistor 26 is selected so that the voltage drop across resistor 26 subtracts from the voltage at terminal 24 to cause a voltage at the base of transistor 17 to be approximately +0.6. v. When the voltage at the base of transistor 17 is +0.6, v., the voltage at the output terminal 39 has a value of approximately 0 v. representing a binary 0. At the same time, when transistors 11 and 12 are nonconductive, current $I_3$ no longer flows through resistor 23 so that the voltage at junction point 25 and at the base of transistor 18 is approximately +1.4 v. The +1.4 v. at the base of transistor 18 causes the voltage at the emitter of transistor 18 and at output terminal 40 to be approximately +0.5 v. representing a binary 1.

The circuit of FIG. 1 functions as an OR-gate by providing a positive voltage, representing a binary 1, at output terminal 39 whenever a positive voltage representing a binary 1 is applied to either input terminal 20 or input terminal 21. The circuit provides a 0 voltage, representing a binary 0 at output terminal 39 when none of the input signals represent a binary 1. The circuit of FIG. 1 also functions as an NOR-gate by providing a positive voltage, representing a binary 1 at output terminal 40 whenever a 0 voltage representing a binary 0 is applied to both terminals 20 and 21. The circuit provides a 0 voltage, representing a binary 0 at output terminal 40 when a binary 1 is applied to either input terminal 20 or to input terminal 21. Thus, the circuit shown in FIG. 1 functions as both an NOR-gate and as an OR-gate without the use of an inverter as required in some prior art circuits.

The emitter-follower circuits, including transistors 17 and 18, provide a low impedance at the output terminals of the circuit of FIG. 1 and provide a large amount of current to output terminals 39 and 40 so that the fan-out of the circuit is very high. For example, when the transistor 17 is rendered conductive, the impedance between output terminal 39 and the +1.4 v. at terminal 24 is extremely low so that a large value of current can flow from terminal 24 through transistor 17 to terminal 39. This large value of current delivered to terminal 39 means that a large number of circuits can be driven from this current at terminal 39. In the same manner, the impedance between terminal 24 and output terminal 40 is low when transistor 18 is rendered conductive and a large value of current can be supplied to output terminal 40. The common-base transistor 15 reduces the input signal required for this circuit and the emitter-follower circuits deliver a large value of output current so that the gain of this circuit is high and the fanout is high.

FIG. 2 illustrates a second embodiment of the invention shown in FIG. 1 wherein like parts have similar reference characters. The circuit in FIG. 2 differs from the circuit of FIG. 1 in that the resistors 36 and 37 are not permanently connected to the emitters of transistors 17 and 18 as shown in FIG. 1. The resistors 36 and 37 can be formed on a chip or block of semiconductor material in which the other resistors and the transistors shown in FIG. 2 may be formed. Resistors 36 and 37 have a terminal at each end so that they can each be connected between a source of reference potential such as ground and the emitter of one of the output transistors. When resistors 36 and 37 are connected as shown in FIG. 2, the circuit provides both OR and NOR logic output signals at terminals 39 and 40 respectively.

In a large data processing system, transmission lines may be connected between one of the output terminals 39 and 40 and a signal-input terminal 20 or 21 of another gate of the type shown in FIG. 2. The impedance of the transmission line should be matched by a terminating resistor at the signal-input terminal to prevent reflections on the transmission line. The leads between terminals 40 and 43 and between 39 and 44 (FIG. 2) would be removed. A lead would be connected between terminal 20 and terminal 43 of resistor 36 and another lead connected between terminal 21 and terminal 44 of resistor 37.

While the principles of the invention have now been made clear in a preferred embodiment, there will be immediately obvious to those skilled in the art many modifications of structure, arrangement, proportions, the elements, materials, and components used in the practice of the invention, and otherwise, which are particularly adapted for specific environments and operating requirements without departing from those principles. The appended claims are therefore intended to cover and embrace any such modifications within the limits only of the true scope of the invention.

I claim:

1. A current-mode logic gate comprising: first and second transistors each having a base, a collector and an emitter, a signal-input terminal, said input terminal being connected to said base of said first transistor; first, second and third reference potentials; first, second and third resistors; a common-base amplifier, said common-base amplifier being connected between said collector of said first transistor and a first end of said first resistor, a second end of said first resistor being connected to said first potential, said second resistor being connected between said emitter of said first transistor and said second potential, said base of said second transistor being connected to said third potential, said emitter of said second transistor being connected to said emitter of said first transistor, said third resistor being connected between said collector of said second transistor and said first potential; and first and second output leads, said first output lead being connected to said common-base amplifier, said second output lead being connected to said collector of said second transistor.

2. A current-mode logic gate as defined in claim 1 including a third transistor having a base, a collector and an emitter; and a second signal-input terminal, said second input terminal being connected to said base of said third transistor, said emitter of said third transistor being connected to said emitter of said first transistor, said collector of said third transistor being connected to said collector of said first transistor.

3. A current-mode logic gate as defined in claim 1 including third and fourth transistors each having a base, a collector and an emitter; fourth and fifth resistors, said base of said third transistor being connected to said first output lead, said fourth resistor being connected between said emitter of said third transistor and said second potential, said fifth resistor being connected between said emitter of said fourth transistor and said second potential, said collectors of said third and said fourth transistors each being connected to said first potential, said base of said fourth transistor being connected to said second output lead; and first and second output terminals, said first output terminal being connected to said emitter of said third transistor, said second output terminal being connected to said emitter of said fourth transistor.

4. A current-mode logic gate as defined in claim 1 including third, fourth and fifth transistors each having a base, a collector and an emitter; a second signal-input terminal; and fourth and fifth resistors, said second input terminal being connected to said base of said fifth transistor, said collector of said fifth transistor being connected to said collector of said first transistor, said emitter of said fifth transistor being connected to said emitter of said first transistor, said base of said third transistor being connected to said first output lead, said base of said fourth transistor being connected to said second output lead, said fourth resistor being connected between said emitter of said third transistor and said second potential, said fifth resistor being connected between said emitter of said fourth transistor and said second potential, said collectors of said third and said fourth transistors being connected to said first potential; and first and second output terminals, said first output terminal being connected to said emitter of said third transistor, said second output terminal being connected to said emitter of said fourth transistor.

5. A current-mode logic gate comprising: first, second and third transistors each having a base, a collector and an emitter; a signal-input terminal, said input terminal being connected to said base of said first transistor; first, second, third and fourth reference potentials; first, second and third resistors, said collector of said first transistor being connected to said emitter of said third transistor, said first resistor being connected between said collector of said third transistor and said first potential, said base of said second transistor being connected to said third potential, said base of said third transitor being connected to said fourth potential, said second resistor being connected between said emitter of said first transitor and said second potential, said emitter of said second transistor being connected to said emitter of said first transistor, said third resistor being connected between said collector of said second transistor and said first potential; and first and second output leads, said first output lead being connected to said collector of said third transistor, said second output lead being connected to said collector of said second transistor.

6. A current-mode logic gate as defined in claim 5 including a fourth transistor having a base, a collector and an emitter; and a second signal-input terminal, said second input terminal being connected to said base of said fourth transistor, said collector of said fourth transistor being connected to said collector of said first transistor, said emitter of said fourth transistor being connected to said emitter of said first transistor.

7. A current-mode logic gate comprising: first, second, third, fourth and fifth transistors each having a base, a collector and an emitter; a signal-input terminal, said signal-input terminal being connected to said base of said first transistor; first, second, third and fourth reference potentials, said collector of said first transistor being connected to said emitter of said third transistor, said base of said second transistor being connected to said third potential, said base of said third transistor being connected to said fourth potential; first, second, third, fourth and fifth resistors, said first resistor being connected between said collector of said third transistor and said first potential, said second resistor being connected between said second potential and said emitters of said first and said second transistors, said third resistor being connected between said first potential and said collector of said second transistor, said base of said fourth transistor being connected to said collector of said second transistor, said base of said fifth transistor being connected to said collector of said third transistor, said collectors of said fourth and said fifth transistors being connected to said first potential, said fourth resistor being connected between said second potential and said emitter of said fourth transistor, said fifth resistor being connected between said second potential and said emitter of said fifth transistor; and first and second output terminals, said first output terminal being connected to said emitter of said fourth transistor, said second output terminal being connected to said emitter of said fifth transistor.

8. A current-mode logic gate as defined in claim 7 including a sixth transistor having a base, a collector and an emitter; and a second signal-input terminal, said second input terminal being connected to said base of said sixth transistor, said collector of said sixth transistor being connected to said collector of said first transistor, said emitter of said sixth transistor being connected to said emitter of said first transistor.

9. A current-mode logic gate comprising: first, second, third, fourth and fifth transistors each having a base, a collector and an emitter; a signal-input terminal, said signal-input terminal being connected to said base of said first transistor; first, second, third, fourth and fifth reference potentials, said collector of said first transistor being connected to said emitter of said third transistor, said base of said second transistor being connected to said third potential, said base of said third transistor being connected to said fourth potential; first, second, third, fourth and fifth resistors, said first resistor being connected between said collector of said third transistor and said first potential, said second resistor being connected between said second potential and said emitters of said first and said second transistors, said third resistor being connected between said first potential and said collector of said second transistor, said base of said fourth transistor being connected to said collector of said second transistor, said base of said fifth transistor being connected to said collector of third said third transistor, said collectors of said fourth and said fifth transistors being connected to said first potential, said fourth resistor being connected between said fifth potential and said emitter of said fourth transistor, said fifth resistor being connected between said fifth potential and said emitter of said fifth transistor; and first and second output terminals, said first output terminal being connected to said emitter of said fourth transistor, said second output terminal being connected to said emitter of said fifth transistor.

10. A high fan-out logic circuit formed on a block of semiconductor material comprising: a current-mode logic gate including a plurality of common-emitter amplifiers, said gate having a plurality of signal-input terminals and first and second output leads; first and second reference potentials; a common-base transistor amplifier having an input lead and an output lead, said input lead of said common-base amplifier being connected to said first output lead of said gate; first and second output transistors each having a base, a collector and an emitter, said base of said first output transistor being connected to said output lead of said common-base amplifier, said base of said second output transistor being connected to said second output lead of said gate, said collectors of said first and said second output transistors each being connected to said first potential; first and second output terminals; first and second resistors; means for connecting said second potential to a first end of said first and said second resistors; means for connecting said emitter of said first output transistor to a second end of said first resistor; and means for connecting said emitter of said second output transistor to a second end of said second resistor, said first output terminal being connected to said emitter of said first output transistor, said second output terminal being connected to said emitter of said second output transistor.

11. A high fan-out logic circuit as defined in claim 10 wherein: said resistors are formed in said block of semiconductor material adjacent to said output terminals.